United States Patent [19]

Mitchell

[11] Patent Number: 5,046,581

[45] Date of Patent: Sep. 10, 1991

[54] LOUDSPEAKER SYSTEM

[75] Inventor: James E. Mitchell, Little Rock, Ark.

[73] Assignee: Sound-Craft Systems, Inc., Morrilton, Ark.

[21] Appl. No.: 352,357

[22] Filed: May 16, 1989

[51] Int. Cl.[5] .......... H05K 5/00

[52] U.S. Cl. .......... 181/152; 181/189; 381/156

[58] Field of Search .......... 181/144, 152, 159, 178, 181/187, 189, 190, 191; 381/90, 154, 156

[56] References Cited

U.S. PATENT DOCUMENTS

| | | | |
|---|---|---|---|
| 1,829,899 | 11/1931 | James | 181/152 |
| 4,206,831 | 6/1980 | Welch et al. | 181/159 |
| 4,635,748 | 1/1987 | Paulson | 181/152 X |
| 4,811,403 | 3/1989 | Henricksen et al. | 181/152 X |
| 4,825,800 | 5/1989 | Kitchen | 181/148 X |

FOREIGN PATENT DOCUMENTS

| | | | |
|---|---|---|---|
| 892793 | 5/1944 | France | 181/148 |

*Primary Examiner*—Brian W. Brown

*Attorney, Agent, or Firm*—Webb, Burden, Ziesenheim & Webb

[57] ABSTRACT

A speaker system includes at least one horn-type speaker. The horn-type speaker is provided with an acoustic waveguide between the driver and horn to space the driver a selected distance from the mouth of the horn.

4 Claims, 3 Drawing Sheets

LOUDSPEAKER SYSTEM

FIELD OF THE INVENTION

This patent relates to loudspeaker systems and, in particular, to the arrangement and placement of the sound radiating devices for the acoustic synchronization of energy from the radiating devices which are mounted with their respective energy exits in the same plane or surface.

BACKGROUND OF THE INVENTION

Loudspeaker systems comprise a plurality of radiating devices for the conversion of electrical signals into acoustic energy (sound). There exists at least two basic types of radiating devices, those of the horn-type and those that have no horn (direct radiator). Each radiating device comprises a driver or motor for the conversion of electrical to mechanical energy. The driver is attached to a diaphragm which distributes mechanical energy of the driver to the air. In a horn-type device, a horn (a rigid, non-absorbing, tapered duct) directs the acoustic energy from the driver and diaphragm to the open end or mouth of the horn. In a hornless driver, the diaphragm is supported by a diaphragm housing which serves to space the driver from the annulus or mouth of the diaphragm.

It is desirable for the sound from each radiating device in a speaker system to arrive at the listening location simultaneously. It is further desired that acoustic wavefronts propagating from each radiating device diverge from a single plane or surface. In a typical speaker system, placement of the radiating devices to satisfy the first requirement (simultaneous arrival of acoustic energy) makes satisfaction of the second requirement (divergence of sound from a single plane or surface) not possible.

The importance of satisfying these two criteria cannot be understated. It is of special importance for loudspeaker systems used in auditoriums. The ability of the audience to hear and understand an individual using the loudspeaker system may be dramatically increased by satisfying these. two requirements. Even though the high and low frequency portions of words and syllables may reach the listener only split seconds apart, the ability of the listener to process the information received will be greatly increased by arranging for the simultaneous arrival of the high and low frequency portions.

In prior art speaker systems, this problem has been addressed by placing the radiating exits of the acoustic devices in a single plane or surface. (The radiating exit of a horn-type radiating device is the mouth of the horn. The radiating exit of a direct radiator device is the annulus of the diaphragm.) An electronic delay is applied to the input signal of any radiating device whose effective length is less than that of the radiating device with the longest effective length. By effective length is meant the distance from the driver to the radiating exit. The acoustic energy from each radiating device is thereby made to arrive at the listening location simultaneously with that from all other devices.

FIG. 1 illustrates an arrangement in accordance with the prior art. A high frequency horn 10 is mounted with the mouth thereof at the panel 11. A low frequency direct radiator is mounted with the annulus 12 of the diaphragm 13 at the panel. A diaphragm housing 14 supports the diaphragm as shown. The effective length of the horn is the distance L2 between the driver 15 and the panel. The effective length of the direct radiator is the distance L1 between the driver 16 and the panel. Due to the differences in the effective lengths L1 and L2 of the two devices, any electrical signal applied simultaneously to both radiators will result in high frequency energy arriving in advance of low frequency energy. The signals are synchronized by applying an electronic delay $\tau$ to the high frequency signal prior to the driver 15. $\tau$ is determined by the following formula:

$$\tau=(L1-L2)/s$$

where s is the speed of sound in air. The delay allows all acoustic energy to arrive simultaneously at the listening position.

The arrangement of FIG. 1 has several drawbacks. All available electronic delay devices 17 must operate at low signal levels (i.e., the signal chain prior to power amplification). This means that one power amplifier 18, 19 is required for each different delay. Bandwidth requirements will often dictate the use of complex and expensive electronic delay systems. The added complexity adds to the cost and the likelihood of component failure. Since the velocity of sound in air varies with temperature, the delay time chosen cannot be correct for all conditions under which the speaker system may be called to perform.

SUMMARY OF THE INVENTION

Briefly, according to this invention, there is provided a speaker system for converting electric signals to acoustic energy for transfer to a listening location. The speaker system comprises a plurality of acoustic radiation devices including at least one horn-type device. The radiation devices are mounted so that the acoustic energy exits of each are substantially in the same plane or surface. The improvement, according to this invention, is providing at least one horn-type device with an acoustic waveguide between the driver and the horn to space the driver a selected distance from the plane or surface such that the sound from the horn-type device and other radiation devices reach the listening location substantially simultaneously. Preferably, all horn-type devices are provided with an acoustic waveguide which spaces the drivers thereof the same distance from the plane or surface containing the acoustic energy exits. Typically, this will be the distance of the driver of a low frequency device from plane or surface.

Also, according to this invention, there is provided a unique horn-type acoustic radiating device comprising an acoustic waveguide having a substantially constant cross-sectional area between the driver and the horn. In one embodiment, the driver and the throat of the horn are provided with connecting surfaces such that waveguides of different lengths can be easily substituted for each other. In an alternate embodiment, the waveguide is provided integral with the horn.

The cross-sectional area of the waveguide should be substantially constant to provide a well behaved acoustic load (impedance) to the driver. The shape and size of the cross section of the waveguide is selected to match the driver exit and the throat of the horn.

It is an advantage of speaker systems, according to this invention, that they can be constructed at lower cost than speaker systems that rely upon electronic delay devices to provide for simultaneous arrival of all frequencies at the listening location.

It is a further advantage of speaker systems, according to this invention, that they are temperature independent and all radiating devices can be driven from a common power amplifier.

BRIEF DESCRIPTION OF THE DRAWINGS

Further features and other objects and advantages will become apparent from the following detailed description made with reference to the drawings in which.

DESCRIPTION OF THE PREFERRED EMBODIMENTS

Figure 2:
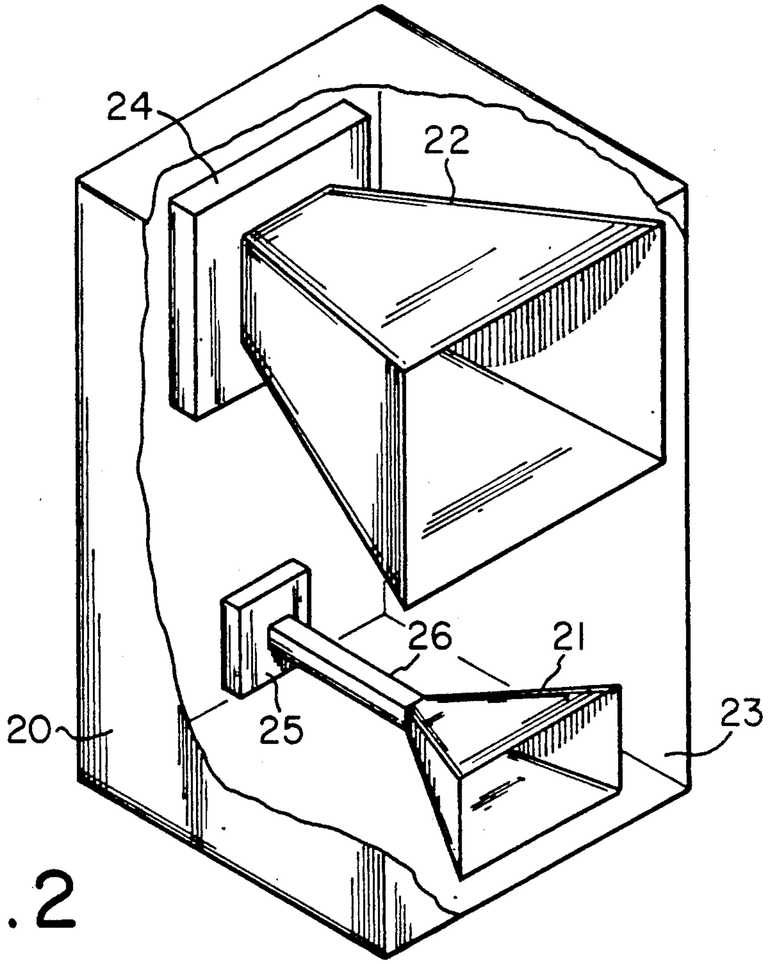
FIG. 2 is a broken away perspective showing the arrangement of two horn-type radiating devices in a loudspeaker system according to this invention.

Referring to FIG. 2, there is shown a speaker cabinet 20 into which two horns 21 and 22 are mounted with the mouth of each horn positioned at the front panel 23 of the cabinet. The horn 22 is a low frequency horn with a low frequency driver 24 connected directly to the throat of the horn. The horn 21 is a high frequency horn with a high frequency driver 25 spaced from the throat of the horn by a waveguide 26. The length of the waveguide is selected so that the distance from each driver to the front panel is substantially equal. In other words, the length of the waveguide is substantially equal to the difference in the effective lengths of the two horns without waveguides.

Figure 1:
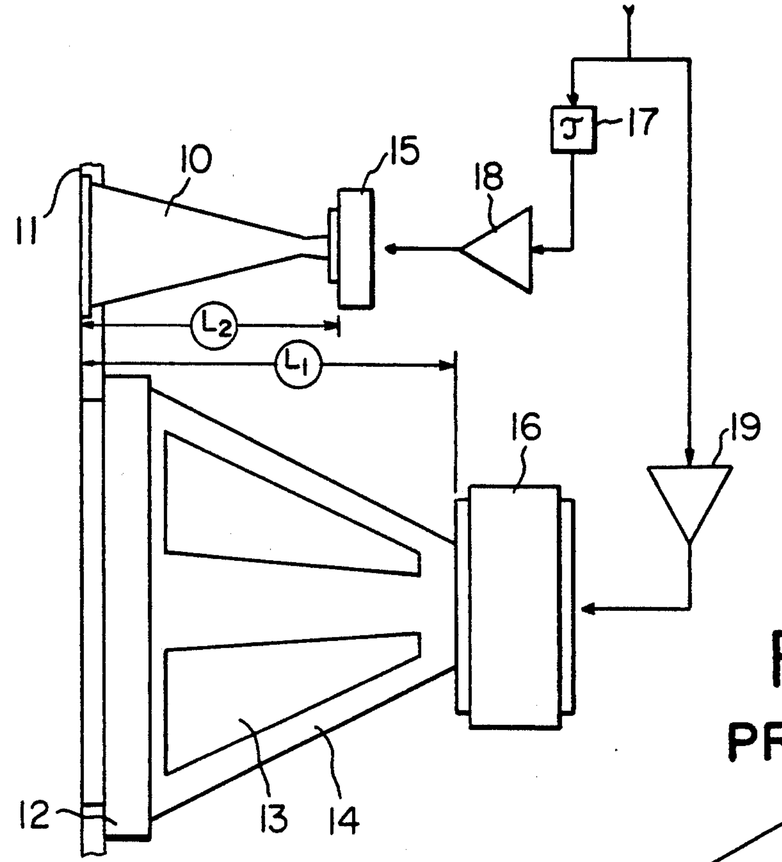
Fig. 1 PRIOR ART
FIG. 1 is a schematic view of a prior art loudspeaker system.
Figure 3:
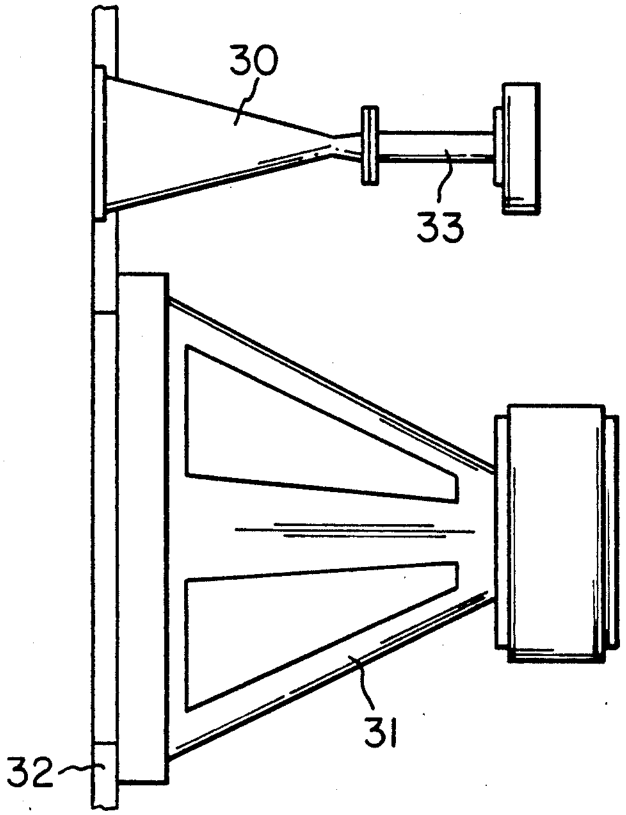
FIG. 3 is a side view showing the arrangement of a high frequency horn and a low frequency direct radiating device in a loudspeaker system according to this invention.

FIG. 3 shows a high frequency horn 30 and a low frequency direct radiating device 31 having an effective length greater than that of the horn. Both are mounted to a front panel 32 so that the energy exits are in the same plane. A waveguide 33 has been placed between the high frequency driver and the horn to space both drivers an equal distance from the front panel. This arrangement fulfills the dual requirement of providing for simultaneous arrival of all frequencies at the listening position and for divergence of sound from a single plane, in this case, the plane of the front panel. FIG. 3 should be directly compared to FIG. 1 wherein fulfilling the dual requirement required the use of electronic delay and multiple power amplifiers.

Figure 4:
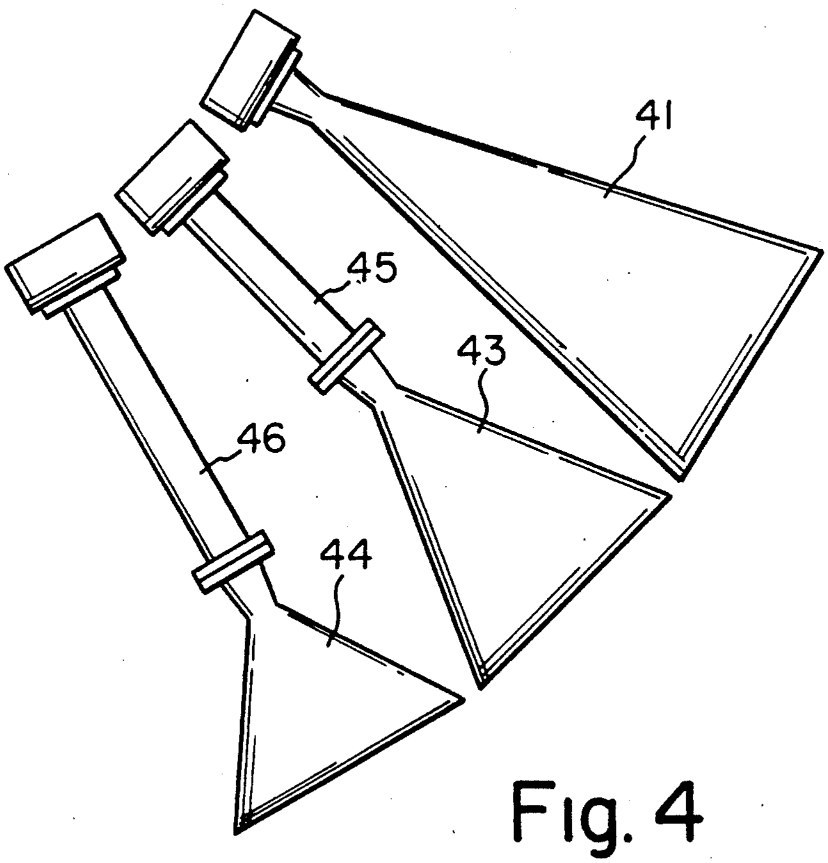
FIG. 4 is a side view showing the arrangement of three horns of like bandwidth having their energy exits (mouths) mounted in a cylindrical surface according to this invention.

The arrangement of FIG. 4 consists of three horns of similar bandwidth and various effective lengths mounted with the mouth of each horn on the same cylindrical surface. The longest horn 41 is connected directly to a driver. The other horns 43 and 44 are connected to their drivers with waveguides 45 and 46 positioned therebetween. The lengths of the waveguides are chosen to provide the simultaneous arrival of acoustic energy from all three horns at the listening position.

Figure 5:
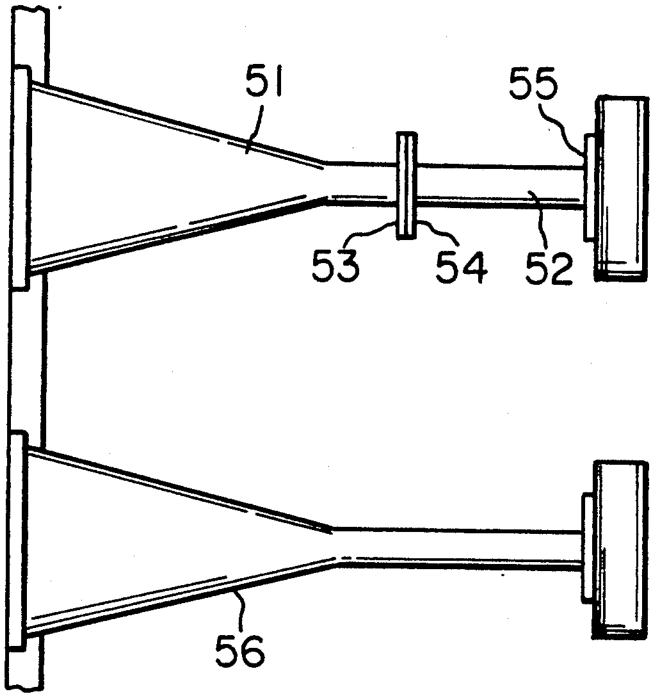
FIG. 5 is a side view illustrating alternate embodiments of horns useful in the practice of this invention.

The horn-type radiator 51 shown in FIG. 5 is constructed so that the waveguide may be replaced. A flange 53 is provided at the throat of the horn. Flanges 54 and 55 are provided at each end of the waveguide. In this way, the horn can be fixed to the waveguide and the waveguide can be fixed to the driver. The horn-type radiator 56 shown in FIG. 5 has an integral waveguide and horn.

Figure 6:
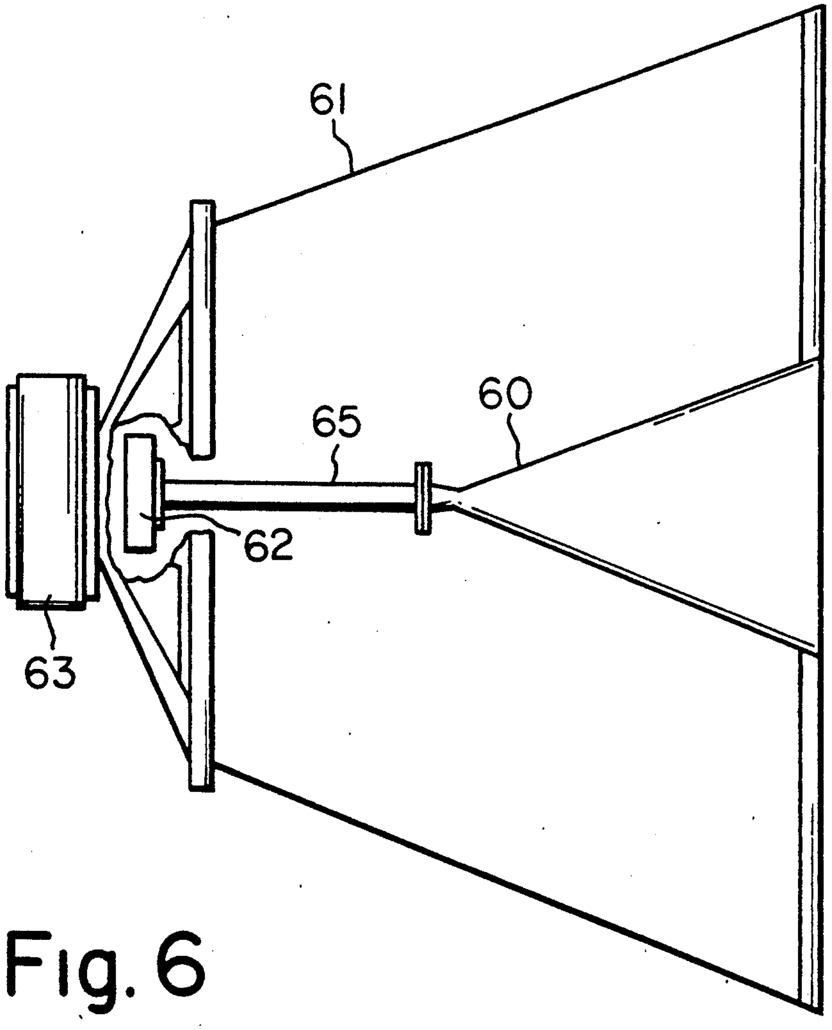
FIG. 6 is a broken away side view illustrating concentric speakers according to this invention.

Referring now to FIG. 6, there is shown a concentric loudspeaker system. A high frequency horn 60 is located centrally within a low frequency horn 61 of greater length. The high frequency driver 62 is located at the approximate acoustic center of the low frequency driver 63. Waveguide 65 enables the high frequency driver and the low frequency driver to be substantially the same distance behind the mouth of each horn.

Having thus described by invention with the detail and particularity required by the Patent Laws, what is claimed and desired to be protected by Letters Patent is set forth in the following claims.

1. A speaker system for converting electric signals to acoustic energy for transfer of said acoustic energy to a listening position, said system comprising:

a plurality of acoustic radiation devices each having drivers for converting electrical to mechanical energy and having acoustic energy exits, said plurality of acoustic radiation devices including at least one horn-type acoustic radiation device defined by a driver for converting electrical to mechanical energy and a horn being a ridged, non-absorbing, tapered duct for directing acoustic energy away from the driver, said horn having larger and smaller ends, the larger end being the acoustic energy exit of the horn-type acoustic radiation device, said plurality of acoustic radiation devices being mounted such that the acoustic energy exits thereof define a geometric surface, and said at least one horn-type acoustic radiation device being provided with an acoustic waveguide between the driver and the horn, said waveguide having a substantially constant cross-sectional area between the driver and the horn, said waveguide spacing the driver a selected distance from the acoustic radiation exit of the horn-type acoustic radiation device such that the selected distance is substantially the same as the distance from the driver of at least one other of said plurality of acoustic radiation devices to the acoustic radiation exit of said at least one other acoustic radiation device whereby the sound generated by the driver of the at least one horn-type acoustic radiation device and sound simultaneously generated by the driver of said at least one other of said plurality of acoustic radiation devices reach the listening position at the same time.

2. A speaker system according to claim 1 wherein the radiation exits for all radiation devices define a plane.

3. A speaker system according to claim 1 wherein the radiation exits for all radiation devices define a cylindrical surface.

4. A speaker system according to claim 1 having a plurality of horn-type radiators wherein all except one of the horn-type radiators is provided with a waveguide such that the sound from all horntype radiators arrives at the listening position simultaneously.

* * * * *